United States Patent [19]

Fairbairn

[11] 4,031,268
[45] June 21, 1977

[54] PROCESS FOR SPRAYING METALLIC PATTERNS ON A SUBSTRATE

[75] Inventor: Thomas E. Fairbairn, Westland, Mich.

[73] Assignee: Sirius Corporation, Toledo, Ohio

[22] Filed: Jan. 5, 1976

[21] Appl. No.: 646,226

[52] U.S. Cl. .................................. 427/12; 118/301;
118/302; 239/79; 239/85; 427/34; 427/58;
427/123; 427/205; 427/282; 427/290;
427/423
[51] Int. Cl.² .......................................... B05D 1/10
[58] Field of Search ............ 427/423, 12, 123, 205,
427/282, 290, 34, 58; 118/301, 302; 239/79,
83, 85

[56] References Cited

UNITED STATES PATENTS

| 3,347,698 | 10/1967 | Ingham | 427/423 |
| 3,607,381 | 9/1971 | Fairbairn | 427/96 |

Primary Examiner—Ralph S. Kendall
Assistant Examiner—John D. Smith
Attorney, Agent, or Firm—Cullen, Settle, Sloman & Cantor

[57] ABSTRACT

Metallic patterns such as electrically conductive pathways are sprayed onto a metallic surface of a substrate by a high temperature flame spray process which process also is used to spray an intermediate layer of ceramic insulation onto the substrate. The patterns are formed in a template through which powdered electrically conductive material is sprayed by a spray gun and a low amperage alternating current of high voltage is applied between the substrate and the spray gun.

5 Claims, 1 Drawing Figure

U.S. Patent     June 21, 1977     4,031,268
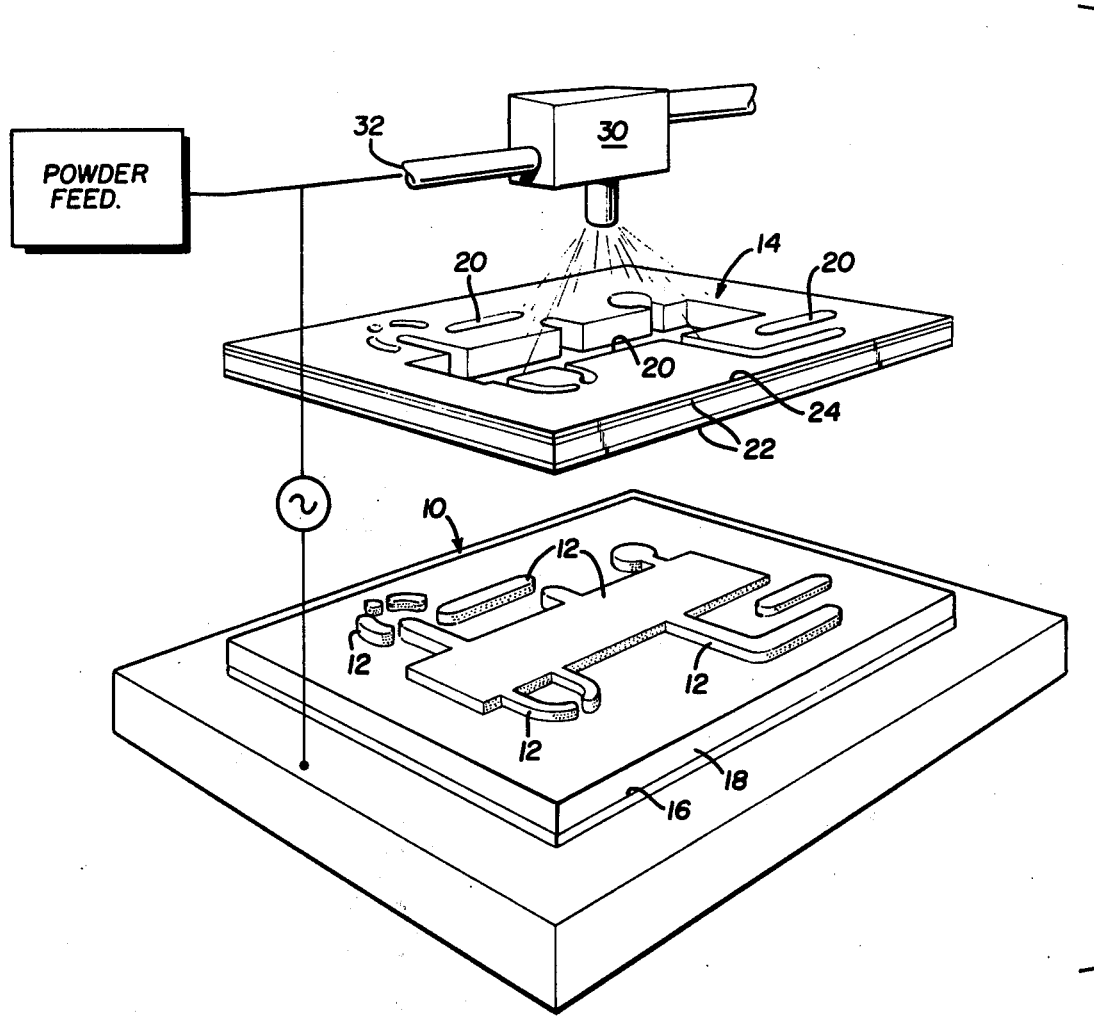

PROCESS FOR SPRAYING METALLIC PATTERNS ON A SUBSTRATE

CROSS-REFERENCE TO RELATED APPLICATION

Some of the subject matter disclosed and claimed herein was disclosed and claimed in my application Ser. No. 52,168, filed July 6, 1970, and now abandoned.

BACKGROUND OF INVENTION

The present invention is an improvement over the process disclosed in my U.S. Pat. No. 3,607,381 of Sept. 21, 1971, which is hereby incorporated by reference.

As set forth in my prior patent, many attempts have been made to fabricate acceptable quality electrical conductors by the spray process which conductors have a high current capacity. Some of the problems include the slow speed of application of the conductors by a spray process and the porosity of the sprayed conductor which then yielded too high an electrical resistance.

SUMMARY OF THE INVENTION

The present invention overcomes these problems by an improved process for economically depositing a high current capacity conductor path pattern upon a supporting base by a spray process. The current carrying capacity of the conductors is increased by application of low amperage A.C. of high voltage between the base and the spray gun during spraying of the conductors.

BRIEF DESCRIPTION OF THE DRAWING

The FIGURE is an exploded perspective view of a base structure to which an insulating layer and circuit conductors have been applied using a template in accordance with the process of this invention.

DETAILED DESCRIPTION OF THE INVENTION

Referring to the drawings, there is illustrated a metallic base 10 upon which electrical circuit conductors 12 are to be formed by spraying a powdered electrical conductor through template 14. Base 10 may be steel or aluminum or any other metallic surface upon which it is desired to place an electrical circuit. The surface of base 10 is first prepared by a cleaning and roughening process, which may be accomplished by a grit blast or by grinding.

Next, the surface of base 10 is coated with a bond-enhancing material 16. This material is applied by the flame spray process, a well-known process for applying powdered metals and ceramics in a stream of high temperature ionized gas using a convention flame or plasma spray gun 30 having a powder feed orifice 32. One such bonding material which has been successfully employed is a nickel alumina powder manufactured by the Metco Company of Long Island, New York, and is identified as Metco 450. During the application of this bonding material to base 10, it is desirable to keep the base cool by the application of an air or nitrogen stream to the base. The thickness of this layer of bonding material is preferably two or three thousandths of an inch, depending upon the thickness of the circuit to be applied thereto.

The next step is to apply an insulation layer 18 on top of the bonding material. The purpose of such a layer 18 is to insulate the subsequently applied electrical circuit conductors from metallic base 10. An insulator which has worked successfully is an aluminum oxide ceramic powder identified as Metco 105. This is a white powder chose for its color and abrasion resistance and hardness as well as its excellent properties as a dielectric and thermal insulator. Another ceramic which can be used is Metco 1161, an alumina-type titanium composite. The important criteria is ohmic resistance. Layer 18 should be sprayed on rather heavily, up to 1/16th of an inch, so that the resistance through it will be on the order of 10 megohms.

To prevent moisture absorption by the ceramic, a Metcoseal phenolic resin can be applied to the ceramic after it has been cleaned by grit blasting.

The next step is the preparation of the template 14. The template must be fabricated of a material capable of withstanding the extremely high temperatures present in the flame spray. A material which has been successfully employed is a ceramic fiber paper known as kaolin manufactured by the Nickel Lead Company of Hamilton, Ohio. More specifically, kaolin is a hydrous silicate of aluminum having a formula of $H_4Al_2Si_2O_9$. This material comes in a thickness of 1/16th to 1/18th of an inch, and can be readily cut by a knife or die-cutting machine. Kaolin is capable of withstanding temperatures of well over 3200° F without disintegrating. If water is applied to the kaolin, it becomes pliable to permit it to conform to curved supports if necessary.

Depending upon the production circumstances, the template can either be expendable or it can be processed to be resuable indefinitely. Such processing to increase its useful life preferably comprises applying be the plasma flame process a ceramic coating to both side of the template, the ceramic having a slightly higher melting point than the copper formulation which will be subsequently sprayed through the template. During this preparation of the template, it is desirable to cool the kaolin with water or air. A Metco masking compound can thereafter be brush applied to the surface to prevent further build-up of metal during the subsequent copper spraying operation. This masking compound should be re-applied after each copper spray operation.

An alternative treatment is to apply a silica slurry to the underside of the template, so as to increase its rigidity. A further alternative is to apply a boric acid powder to the surface and melt the powder with a low temperature plasma flame to create a boric glass to provide greater rigidity. Boric acid also prevents subsequent oxidation of the template. A rigid peripheral frame may also be used. Such frame could be made magnetic to aid in anchoring it.

The template is then placed upon the ceramic insulating layer 18. It has been found that retention and adherence of the kaolin template to a flat or curved ceramic surface 18 can be improved by wetting the template with water. This also functions to keep the template from overheating.

Next, a plasma flame spray gun is utilized to spray the conductor such as copper through the template onto the ceramic surface. The copper may be in the form of a glass copper powder manufactured by Metco and identified as XT1169, in a mixture of 140 and 235 meshes.

To improve conductivity of the copper coating, a supplementary voltage is applied to the workpiece during the copper application process. Specifically a voltage of 3,000 to 10,000 volts A.C. is applied between the substrate 10 and the powder feed orifice of the spray gun. The current should be low, such as 10–40-milliamps, and the frequency is preferably about 60cycles per second, although much higher frequencies are also effective. This technique results in a copper layer having substantially higher electrical conductivity approaching 60% that of comparable circular drawn copper as compared with only 13% when the standard plasma process is used without the supplementary voltage. The substrate functions as one plate of a capacitor with the insulator 18 serving as the dielectric. The copper as deposited becomes the second plate to capacitively complete the circuit. The capacitance is about 10picofarads.

It is thought the the improvement in electrical conductivity of the copper resulting form the use of the supplementary voltage may be explained be an increased density of the copper atoms in the finished product. The alternating current may cause half of the copper atoms to orient north-south, and the other half south-north, creating a condensing or attraction effect similar to the magnetic attraction between opposite poles of a magnet.

After the copper has been applied, the conductor surface can be polished if desired. Furthermore, a layer of ceramic insulation can be spray applied over the surface if desired in order to prevent impact and abrasion damage to the circuitry and also to protect persons from electrical shock.

Although this invention has been described as applied to the making of electrically conductive pathways, the template disclosed and claimed herein could similarly be employed in conjunction with the plasma flame spray process to form artistic designs or signs, as well as other types of metallic patterns.

The basic process can also be used to stack multiple layers of plasmapplied circuits to save space. Thus, a ceramic layer can be sprayed over a first copper circuit layer, and an additional copper circuit layer sprayed over the interposed ceramic layer.

This invention may be further developed within the scope of the following claims. Accordingly, the above specification is to be interpreted as illustrative of only one operative embodiment of this invention, rather than in a strictly limited sense.

I now claim:

1. In a method of spraying metallic patterns such as conductors of an electrical circuit onto a metallic supporting surface of a supporting base including cleaning and roughening the supporting surface; spraying a powdered bonding material onto the supporting surface by means of the flame spray process; spraying a powdered ceramic insulation layer onto the supporting surface by means of the flame spray process; and applying a self-supporting template to the ceramic-coated supporting surface, said template conforming the desired configuration of the electrical circuit conductors; the improvement comprising: spraying a powdered electrically conductive material through said template and onto said ceramic-coated surface by means of the flame spray process with a spray gun having a powder feed orifice and simultaneously apply a low amperage high voltage A.C. signal between the powder feed orifice of said gun and said metallic supporting surface; whereby an electrical circuit corresponding to the configuration of said template is formed on top of said ceramic-coated surface, with said ceramic coating insulating said current conductors from said metallic supporting surface.

2. The method of claim 1, wherein the template is reusable high heat resistant ceramic fiber paper pretreated on both sides by the aplication of a ceramic coating by means of the flame spray.

3. The method of claim 2 wherein the ceramic fiber paper is kaolin.

4. The method of claim 1 wherein said voltage is in the range of 3,000 to 10,000 volts.

5. The method of claim 1, wherein said current is in the range of ten-to-forty milliamps.

* * * * *